(12) United States Patent
Huang

(10) Patent No.: US 6,472,595 B1
(45) Date of Patent: Oct. 29, 2002

(54) COMPACT FLASH CARD

(75) Inventor: Wayne Huang, Alhambra, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/351,426

(22) Filed: Jul. 12, 1999

(51) Int. Cl.7 ................................................. H05K 9/00
(52) U.S. Cl. ...................... 174/35 R; 361/737; 361/752; 361/818
(58) Field of Search ........................ 174/35 R, 35 GC; 361/799, 800, 816, 818, 728, 737, 752, 753, 759; 439/946

(56) References Cited

U.S. PATENT DOCUMENTS

| | | | |
|---|---|---|---|
| 5,107,404 A | * 4/1992 | Tam | 361/424 |
| 5,426,286 A | * 6/1995 | Nair et al. | 235/449 |
| 5,506,373 A | * 4/1996 | Hoffman | 174/35 GC |
| 5,563,772 A | * 10/1996 | Nichols | 361/752 |
| 5,838,542 A | * 11/1998 | Nelson et al. | 361/704 |
| 5,894,408 A | * 4/1999 | Stark et al. | 361/704 |
| 5,923,026 A | * 7/1999 | Onoda | 235/492 |

* cited by examiner

*Primary Examiner*—Dean A. Reichard
*Assistant Examiner*—Carmelo Oliva
(74) *Attorney, Agent, or Firm*—WeiTe Chung

(57) ABSTRACT

A compact flash card includes a lower half defining a receiving space by peripheral wall thereof. A pair of posts is arranged diagonally on the lower half. An upper half is assembled to the lower half defining at least a pair. of holes corresponding to the posts. The upper and lower halves each includes a metal panel. A gap is defined between the lower and upper halves for receiving a printed circuit board. The printed circuit board includes a pair of holes corresponding to the posts. The posts extend through the holes of the printed circuit board and establish a grounding path between the upper and lower metal panels.

5 Claims, 8 Drawing Sheets

COMPACT FLASH CARD

FIELD OF THE INVENTION

The present invention relates to a compact flash card, and more particularly to a compact flash card having enhanced rigidity and grounding effect.

DESCRIPTION OF PRIOR ART

An electrical card generally includes upper and lower halves assembled together, and a printed circuit board disposed therein. The printed circuit board is mounted with the connector for mating with another complimentary connector. In order to ensure reliable signal transmission, metal panels are assembled to the upper and lower casings to shield interference. Because the electrical card has a comparable thin thickness, it can be readily warped thereby damaging the compact card.

SUMMARY OF THE INVENTION

An objective of this invention is to provide a compact flash card with comparable thin thickness while having enhanced rigidity and grounding effect.

In order to achieve the objective set forth, a compact flash card comprises a lower half defining a receiving space by peripheral wall thereof. A pair of posts is arranged diagonally on the lower half. An upper half is assembled to the lower half defining at least a pair of holes corresponding to the posts. The upper and lower halves each includes a metal panel. A gap is defined between the lower and upper halves for receiving a printed circuit board. The printed circuit board includes a pair of holes corresponding to the posts. The posts extend through the holes of the printed circuit board and establish a grounding path between the upper and lower metal panels.

These and additional objects, features, and advantages of the present invention will become apparent after reading the following detailed description of the preferred embodiment of the invention taken in conjunction with the appended drawings.

DETAILED DESCRIPTION OF PREFERRED EMBODIMENT

Figure 1:
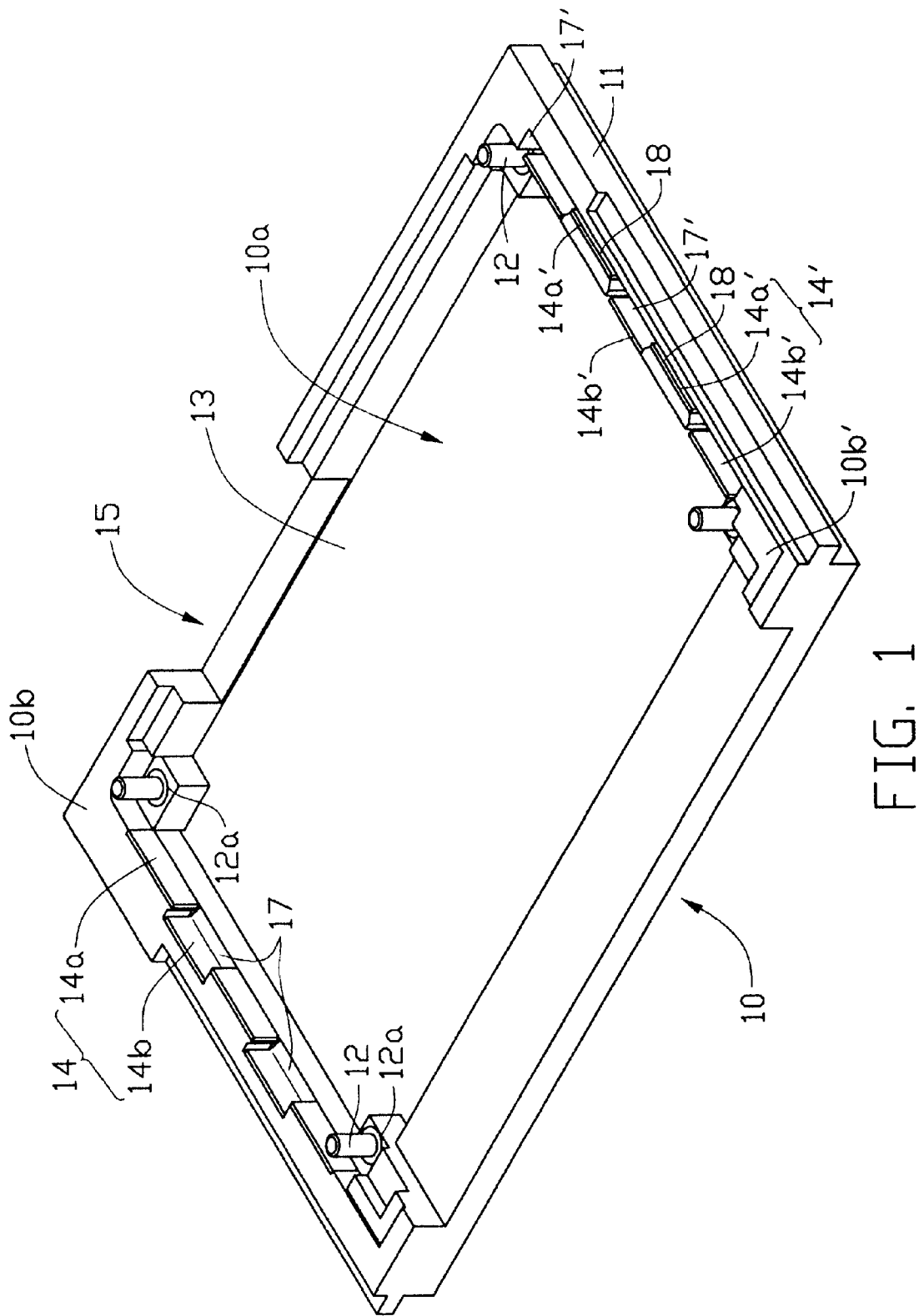
FIG. 1 is a perspective view of a lower half with a lower metal panel thereof in accordance with the present invention.

Referring to FIGS. 1 to 6, a compact flash card 1 in accordance with the present invention comprises a lower half 10 defining a receiving space 10a by peripheral frame 11 thereof. Four posts 12 are arranged diagonally on the lower half 10. The lower half 10 further includes a lower metal panel 13 for EMI shielding interference, best viewed from FIG. 6. The lower metal panel 13 is integrally formed with the lower half 10. Each post 12 further includes a socket 12a integrally formed with the lower half 10 and the post 12 is inserted therein afterwards. The lower half 10 defines an opening 15 at a rear side (not labeled) for extension of a first connector 33.

An upper half 20 assembled to the lower half 10 defines a receiving space 20a therein by a peripheral frame 21. Four holes 22 corresponding to the posts 12 are defined in the frame 21. Each hole 22 is defined in a socket 12b which is integrally formed with the frame 21. The upper half 20 includes also a metal panel 23 engageable with the lower metal panel 13 for EMI shielding. The upper-half 20 defines a front opening 25 at a front side thereof for extension of a second connector 35.

A gap 1a (best viewed from FIG. 6 and 8) is defined between the lower and upper halves 10, 20 when both are assembled to receive a printed circuit board 30 therebetween. The printed circuit board 30 includes two holes 31 and two cutouts 32 corresponding to the posts 12. The posts 12 extend through the holes 31 of the printed circuit board 30 thereby the rigidity of the printed circuit board 30 can be used to strengthen the rigidity of the compact flash card 1. In addition, when the posts 12 and the sockets 12a, 12b are made from metal, additional grounding path between the upper and lower metal panels 10, 20 can be established. Both the first and second connectors 33, 35 are assembled to the printed circuit board 30 before the printed circuit board 30 is assembled.

Figure 6:
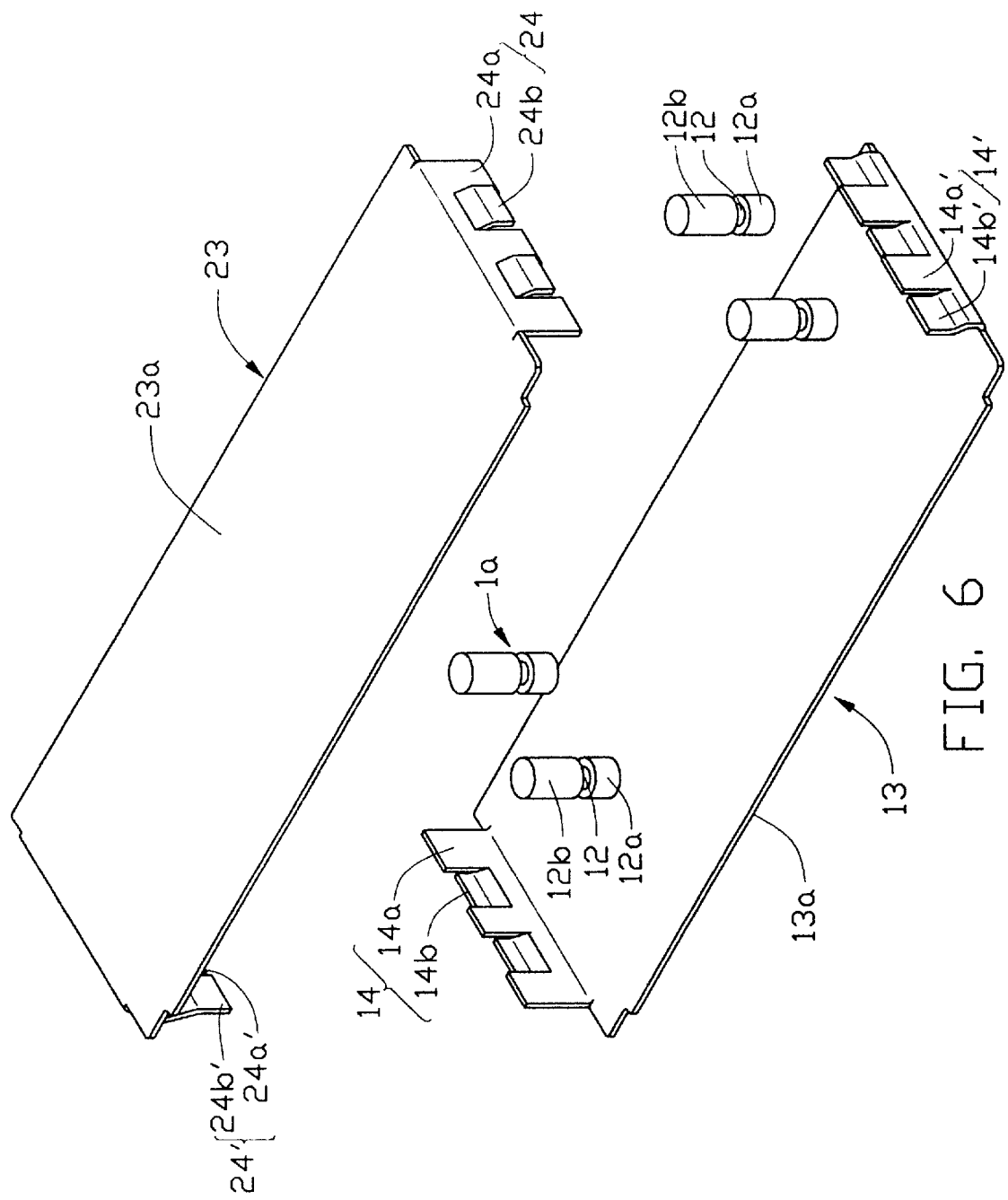
FIG. 6 is an exploded view of the upper metal panel, lower metal panel and posts in accordance with the present invention.
Figure 7:
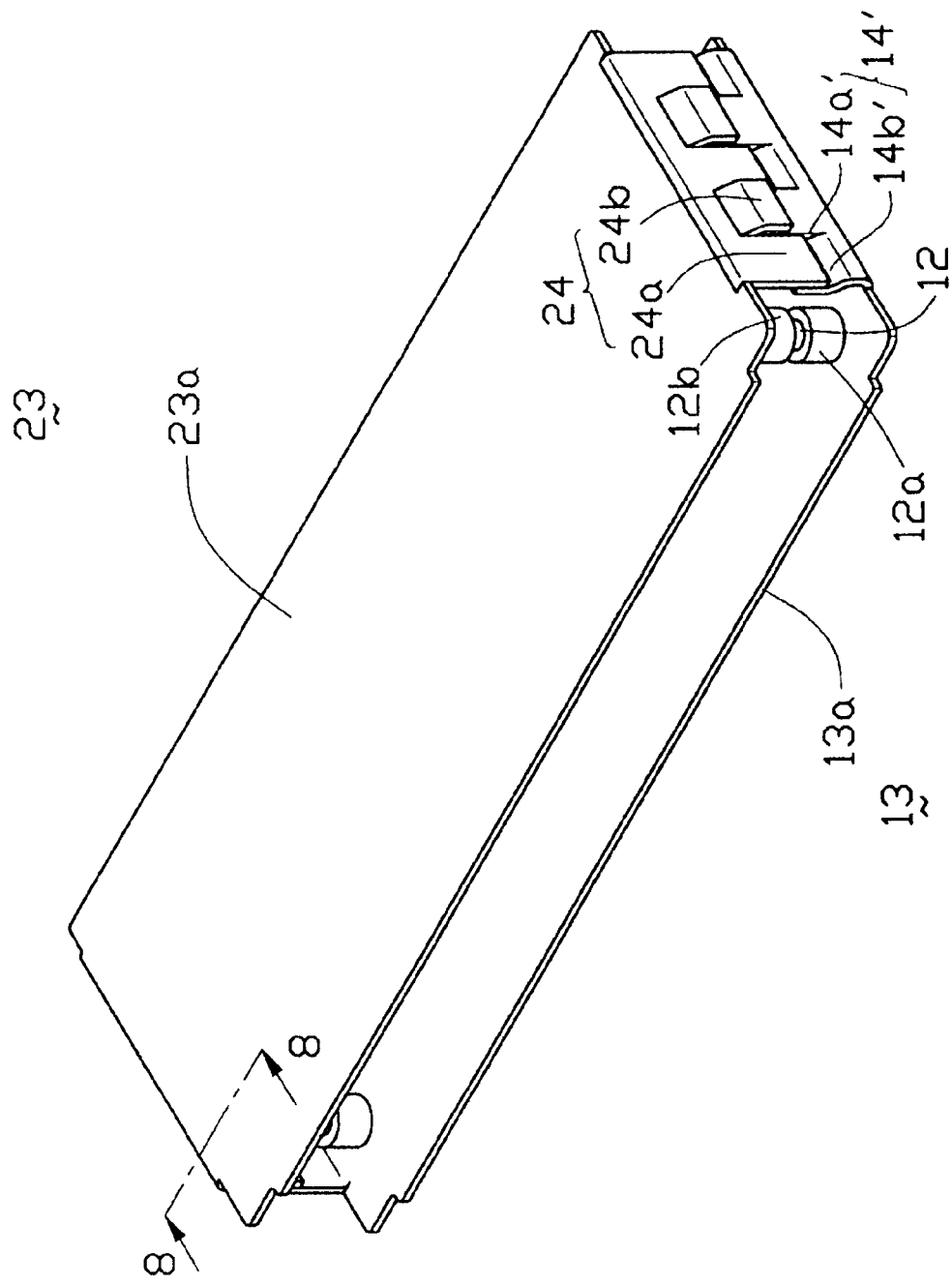
FIG. 7 is an assembled view of FIG. 6.
Figure 8:
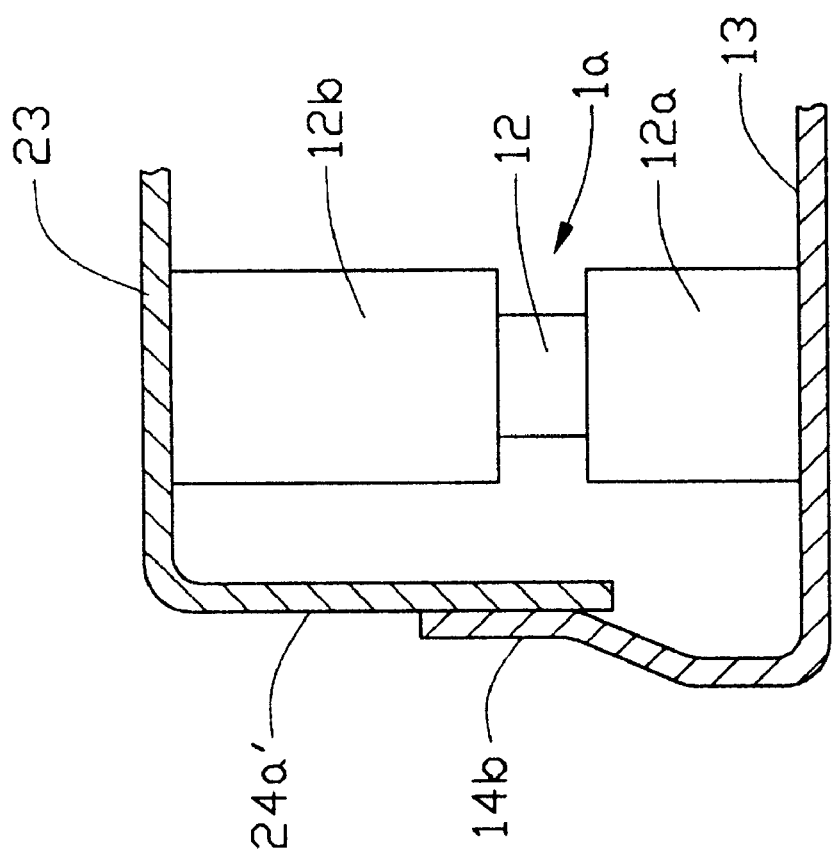
FIG. 8 is a partial cross sectional view taken along line VIII—VIII of FIG. 6.

Referring to FIGS. 6, 7 and 8, the upper and lower metal panels 13, 23 and the posts 12 used to shield interference to signal transmissions in the compact flash card 1 are clearly described as below. Each panel 13 (23) includes a base portion 13a (23a) having end walls 14 (24) configured by vertical and offset tabs 14a, 14b (24a, 24b). The upper and lower metal panels 23, 13 are integrally formed with the upper and lower halves 20, 10, respectively. When the upper and lower halves 20, 10 are assembled, the vertical tab 14a (14a') of the lower half 10 is engaged with the offset tab 24b' (24b) of the upper half 20 while the offset tab 14b (14b') of the lower half 10 is engaged with the vertical tab 24a' (24a) of the upper half 20. By this arrangement, the upper and lower panels 20, 10 establish a robust shield for the first and second connectors 33, 35 and the printed circuit board 30. In addition, when the posts 12 and the sockets 12a, 12b are made from metal material, additional grounding paths are established between the upper and lower halves 20, 10. Accordingly, signal transmission via the compact flash card 1 can be further ensured.

Figure 2:
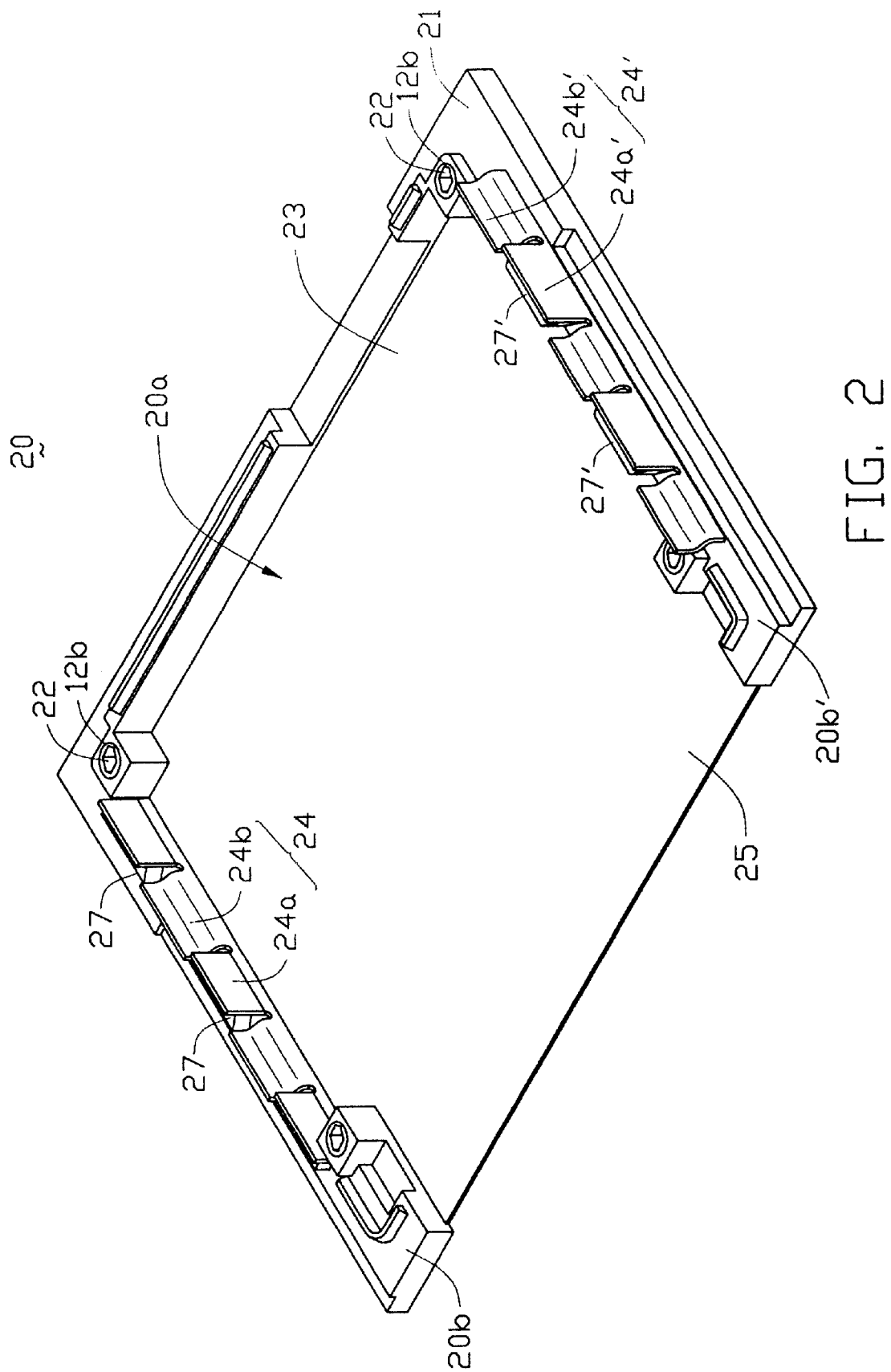
FIG. 2 is a perspective view of an upper half with an upper metal panel thereof in accordance with the present invention.
Figure 3:
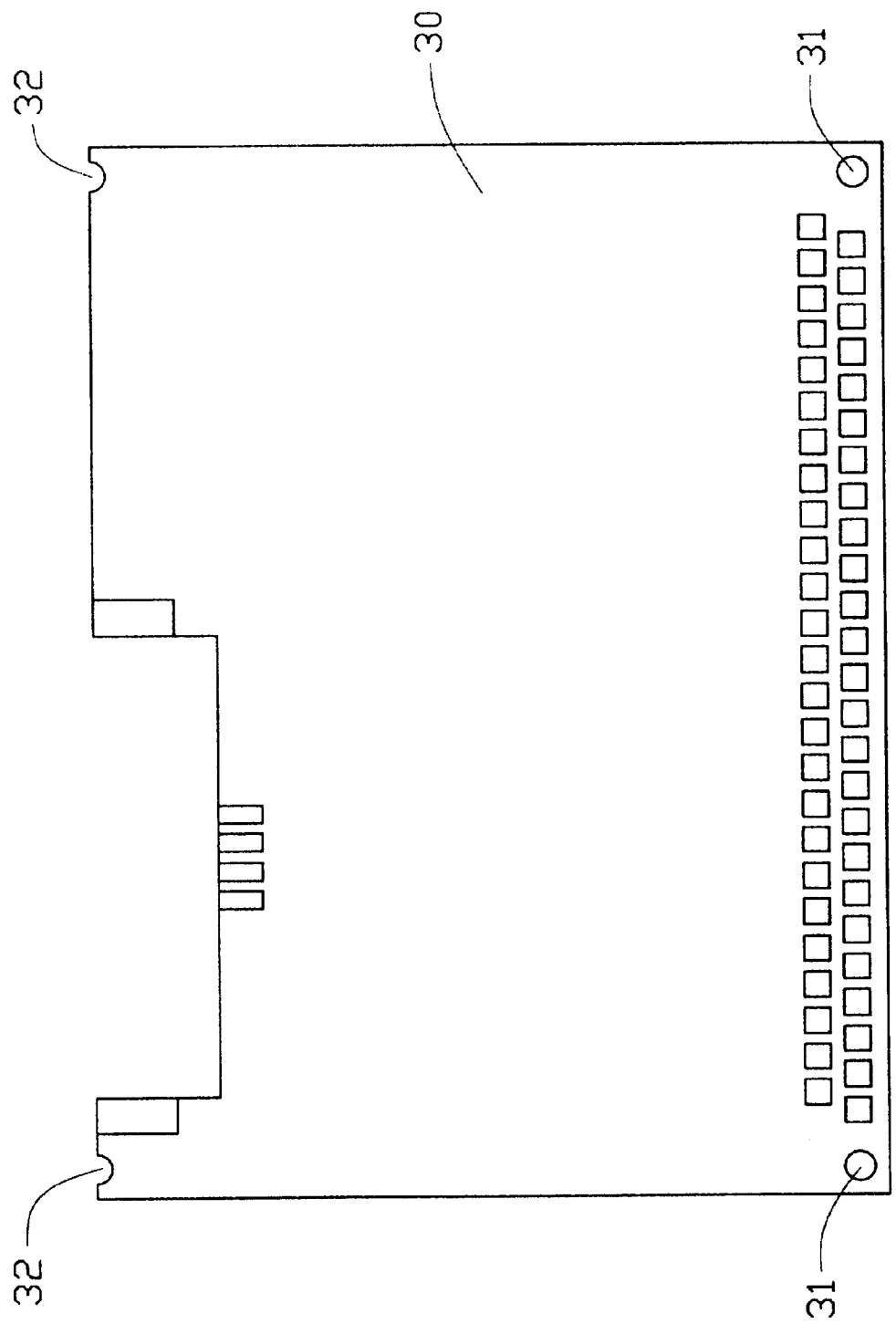
FIG. 3 is a top plan view of a printed circuit board in accordance with the present invention.
Figure 4:
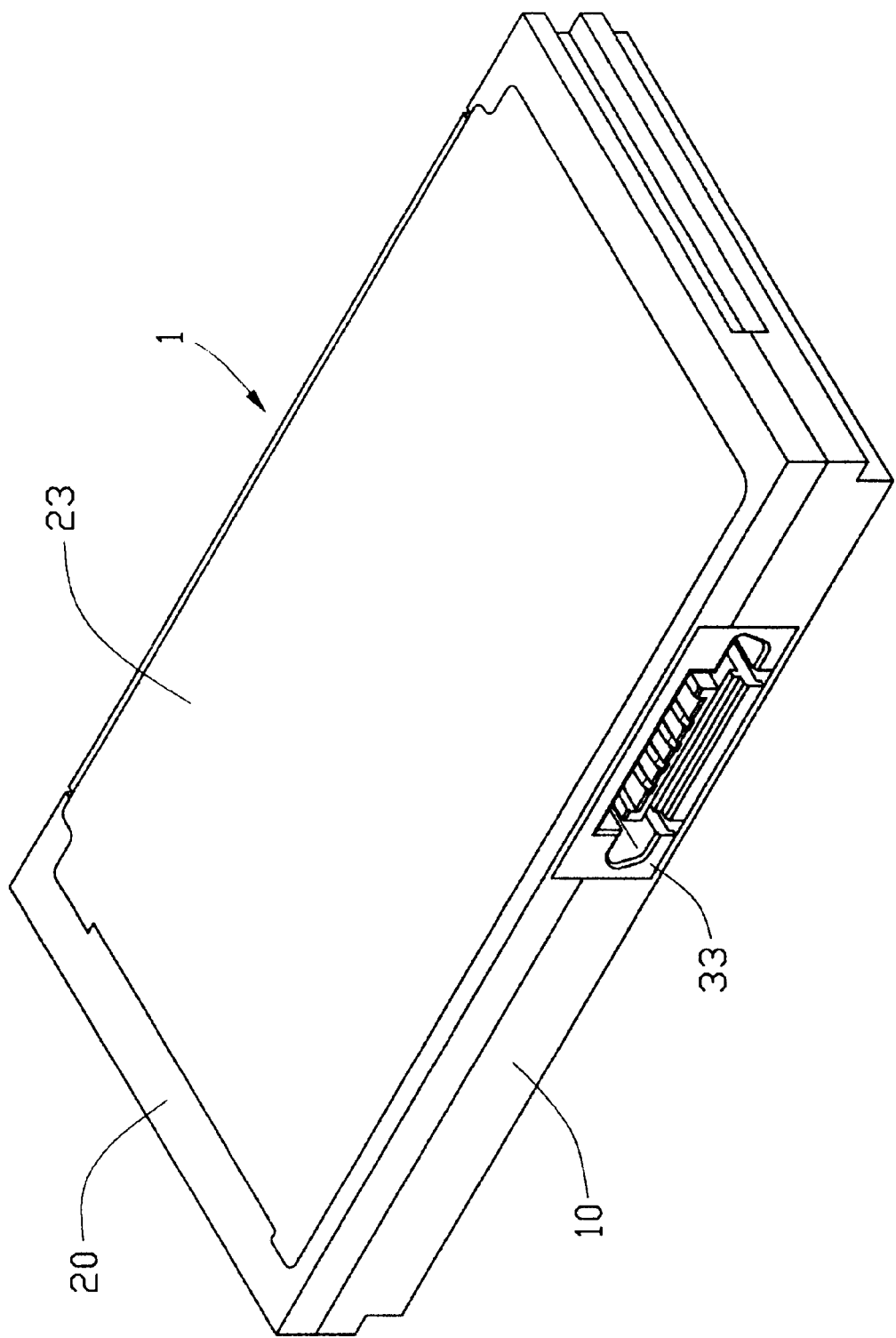
FIG. 4 is an assembled view of the lower half, the upper half with first and second connectors assembled therebetween.
Figure 5:
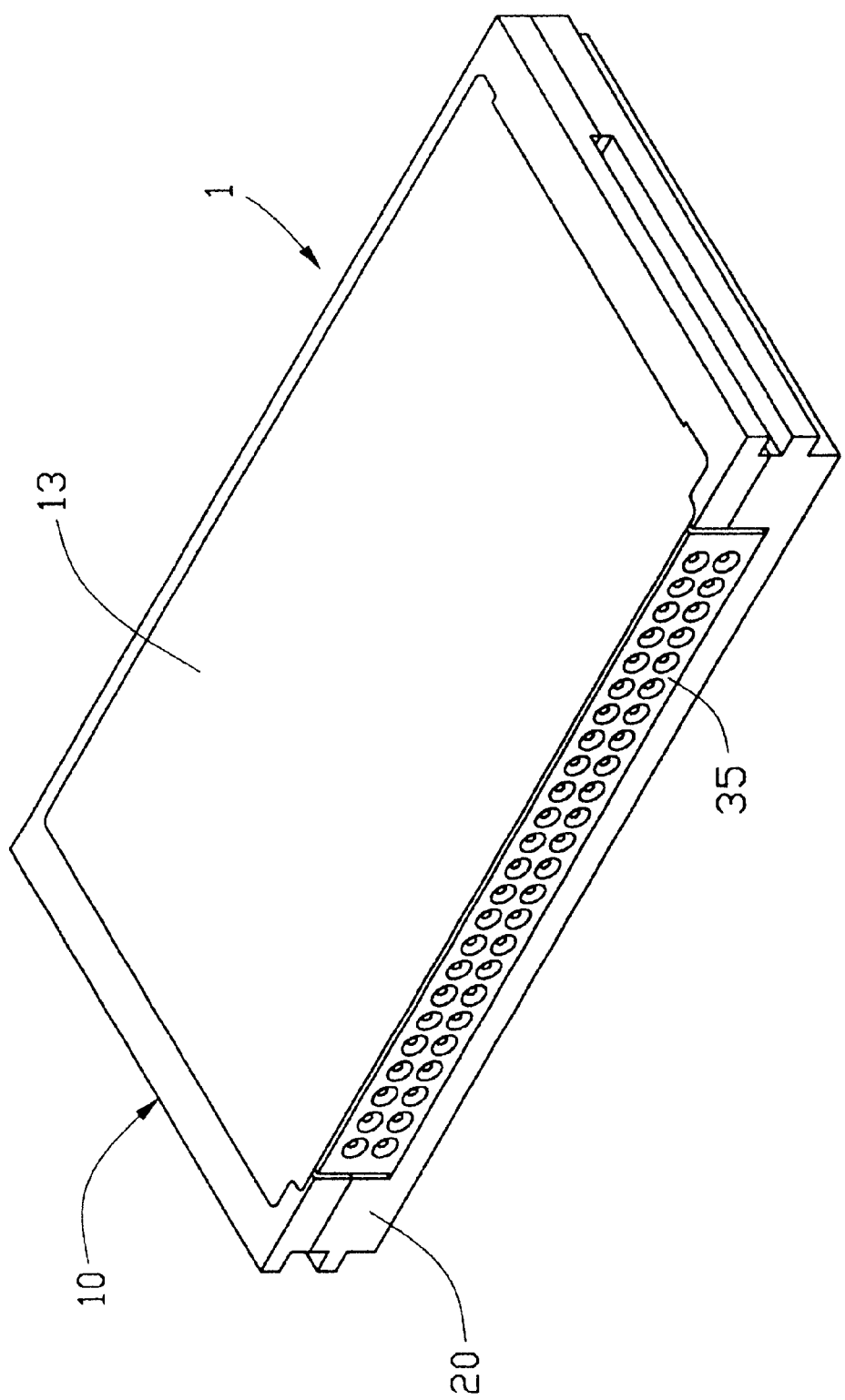
FIG. 5 is a similar to FIG. 4 viewed from a reversed angle.

Still referring to FIGS. 1 and 2, assembly between the lower and upper halves 10, 20 are facilitated by recess 17 and block 27 arrangement. According to the present embodiment, the lower half 10 defines total five recesses 17 (17') in opposite walls 10b (10b') thereof. In addition, during the formation of the lower half 10 and the lower metal panel 13, the offset tabs 14b are located in the inner wall (not labeled) of the recesses 17 of the wall 10b, while the vertical tabs 14a are located in the inner side of the transversal wall 10b. However, because the vertical and offset tabs 14a, 14b are arranged alternatively, in the opposite transversal wall 10b', the offset tabs 14b' are located at the outmost of the recesses 17' and flush with the inner side of the transversal wall 10b', while the vertical tabs 14a are located in slits 18 defined between two adjacent recesses 17'.

The upper half 20 is formed with a plurality of the blocks 27 (27') corresponding to the recesses 17' (17) of the lower half 10 in the transversal walls 20b' (20b). During the formation of the upper half 20 and the upper metal panel 23, the vertical tabs 24a are located in the inner side of the transversal wall 20b, while the offset tabs 24b are located between the blocks 27. However, in the opposite wall 20b', the offset tabs 24b' flushes with inner side of the wall 20b', while the vertical tabs 24a' extend from back faces of the blocks 27'. In addition, the height of the vertical and offset tabs 24a, 24b are higher than the blocks 27 (27') and portions of the vertical and offset tabs 24a, 24b extend over top faces of the blocks 27 (27'). This arrangement is for engagement to the offset and vertical tabs 14b', 14a' of the lower half 10 at the opposite transversal wall 10b'.

When the upper half 20 is assembled to the lower half 10, the transversal wall 20b is mated with the transversal wall 10b' with the blocks 27 of the wall 20b received in the corresponding recesses 17' of the wall 10b, while the transversal wall 20b' is mated with the transversal wall 10b with the blocks 27' of the wall 20b' received in the corresponding recesses 17 of the wall 10b. In the mating arrangement between the walls 20b' and 10b, the vertical tab 24a' is electrically engaged with the offset tab 14b and the offset tab 24b' is engaged with the vertical tab 14a. However, in the mating arrangement between the walls 20b and the 10b', the vertical tab 24a is engaged with the offset tab 14b', and the offset tab 24b is firstly inserted into the corresponding slit 18 and then electrically engaged with the vertical tab 14a'.

Although the present invention has been described with reference to the preferred embodiment, it is apparent to those skilled in the art that a variety of modifications and changes may be made without departing from the scope of the present invention which is intended to be defined by the appended claims.

I claim:

1. A grounding assembly for use with a compact flash card, comprising:

a lower metal panel including an end wall configured with a plurality of alternately arranged vertical and offset tabs;

an upper metal panel being assembled with said lower metal panel the upper metal panel including an end wall configured with a plurality of alternately arranged vertical and offset tabs and mating with the end wall of the lower metal panel; and at least a metal post bridged between said upper and lower metal panels.

2. The grounding assembly as recited in claim 1, wherein each vertical tab of said upper panel is mated with a corresponding offset tab of said lower panel and each said offset tab of said upper panel is mated with a corresponding vertical tab of said lower panel.

3. A shielded housing for use with an input/output card, comprising:

a first half formed by a peripheral first frame, the first frame forming at least a block on a sidewall thereof;

a first metal panel integrally formed with said first half and having end walls partially located in an inner side of the sidewall;

a second half assembled with said first half, said second half being formed by a peripheral second frame, the second frame defining at least a recess on another sidewall thereof corresponding to said block of the first frame; and a second metal panel having end walls extending into said at least a recess of said second frame to electrically engage with the end walls of said first metal panel when said at least a recess is mated with said at least a block, said second metal panel being integrally formed with said second half.

4. The shielded housing as recited in claim 3, wherein each said end wall of said panels includes a vertical tab and an offset tab alternately arranged.

5. The shielded housing as recited in claim 4, wherein a slit is defined between said block and said sidewall of said first frame for receiving said vertical tab from said first metal panel.

* * * * *